US006440849B1

(12) United States Patent
Merchant et al.

(10) Patent No.: US 6,440,849 B1
(45) Date of Patent: Aug. 27, 2002

(54) MICROSTRUCTURE CONTROL OF COPPER INTERCONNECTS

(75) Inventors: Sailesh Mansinh Merchant; Pradip Kumar Roy, both of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/419,986

(22) Filed: Oct. 18, 1999

(51) Int. Cl.[7] ............................................... H01L 21/44
(52) U.S. Cl. ........................ 438/658; 438/660; 438/687
(58) Field of Search ................................ 438/660, 687, 438/658, 659; 205/182, 183

(56) References Cited

U.S. PATENT DOCUMENTS

| | | | | |
|---|---|---|---|---|
| 4,274,872 A | * | 6/1981 | Melton et al. ............ | 75/157.5 |
| 4,777,078 A | | 10/1988 | Myabayashi | |
| 5,209,817 A | * | 5/1993 | Ahmad et al. ............ | 156/643 |
| 5,719,447 A | | 2/1998 | Gardner | |
| 5,985,763 A | * | 11/1999 | Hong et al. ............... | 438/688 |
| 6,022,808 A | * | 2/2000 | Nogami et al. ............ | 438/694 |
| 6,123,825 A | * | 9/2000 | Uzoh et al. ............... | 205/183 |
| 6,126,806 A | * | 10/2000 | Uzoh ........................ | 205/182 |
| 6,130,156 A | * | 10/2000 | Havemann et al. ........ | 438/637 |
| 6,242,808 B1 | * | 6/2001 | Shimizu et al. ............ | 257/762 |

FOREIGN PATENT DOCUMENTS

| | | |
|---|---|---|
| EP | 0 721 216 A2 | 7/1996 |
| EP | 0 725 439 A2 | 8/1996 |
| EP | 0 751 567 A2 | 1/1997 |
| GB | 2 327 811 A | 2/1999 |
| JP | 60-77947 A * | 5/1985 |
| JP | 0 163 830 | 12/1985 |
| JP | 0 281 038 | 9/1988 |
| JP | 0 335 383 | 10/1989 |
| WO | WO 99/47731 | 9/1999 |

OTHER PUBLICATIONS

IBM Technical disclosure Bulletin, vol. 35(7), pp. 133–134. Dec. 1992.*
R. L. Jackson, et al., "Processing and Integration of Copper Interconnects", Solid State Technology, 49–59, Mar. 1998.
X. W. Lin et al., "Future Interconnect Technologies and Copper Metallization", Solid State Technology, 63–79, Oct. 1998.
P. Singer, "Tantalum, Copper and Damascene: The Future of Interconnects", Semiconductor International, 91–98, Jun. 1998.
The Metals Handbook, 8th Edition, vol. 1, p. 802, "Properties and Selection of Metals". No date.
M. M. Walczak et al., "Modified Electrode Surfaces", The Electrochemical Society, 4th Edition, p. 39, 1977.

* cited by examiner

Primary Examiner—Olik Chaudhuri
Assistant Examiner—Erik Kielin

(57) ABSTRACT

A method and structure is described which substantially eliminates the grain growth of copper due to self annealing. Basically, by alloying the copper interconnect e.g. with Cr, Co, Zn or Ag in an amount which does not cause a second phase or precipitation at the annealing temperature, one can control and maintain the grain size of the copper and hence achieve a uniform microstructure while improving the strength, hardness and CMP removal rate of the interconnect while substantially maintaining the conductivity of the copper.

7 Claims, 1 Drawing Sheet

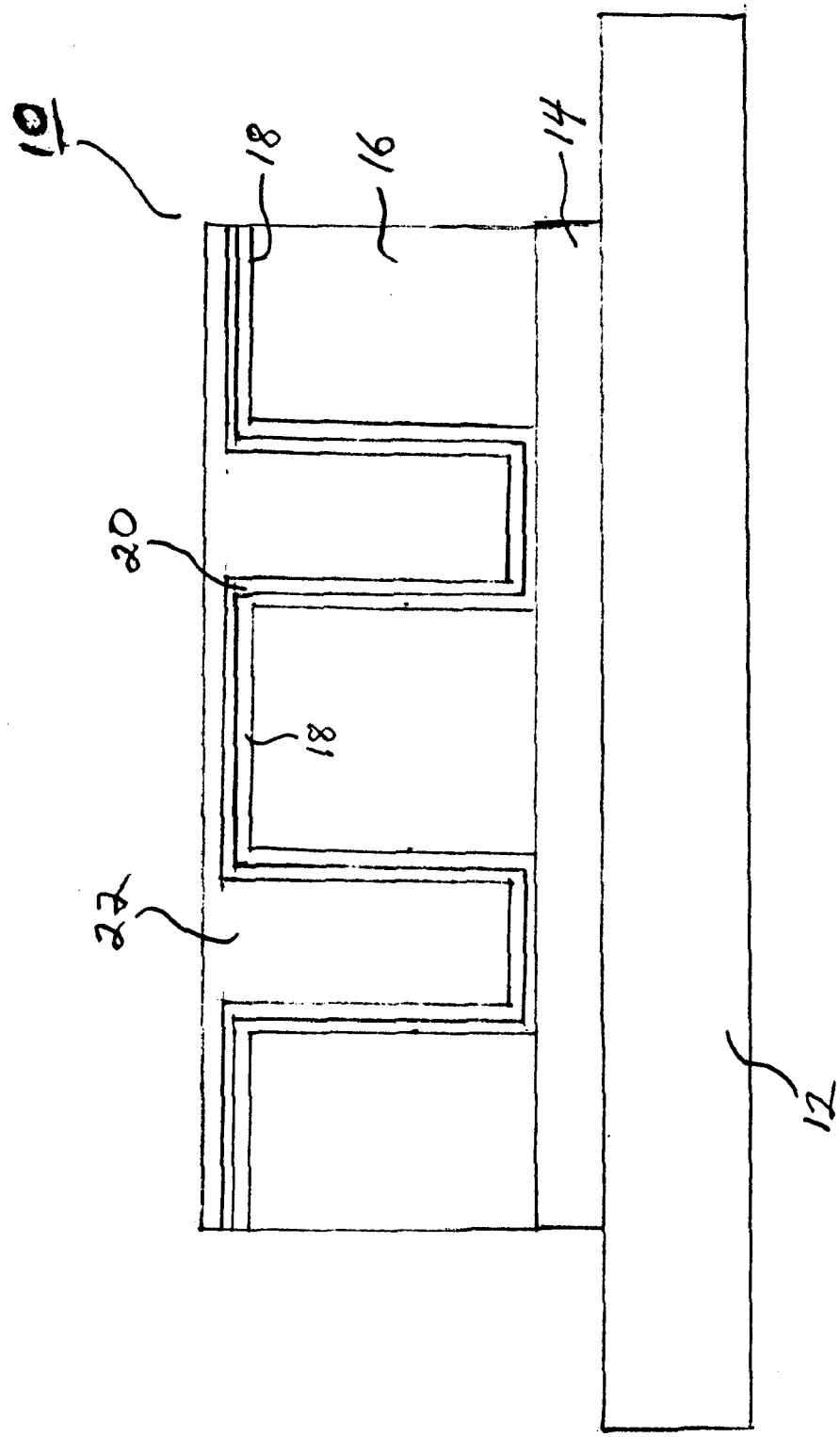

MICROSTRUCTURE CONTROL OF COPPER INTERCONNECTS

BACKGROUND OF THE INVENTION

1. Field of the Invention

This invention relates to integrated circuits employing copper interconnects and more particularly to the control of the copper interconnect microstructure to obtain improved interconnects.

2. Description of the Related Art

A major limiting factor in ULSI interconnect technology is RC time delay introduced by the coupling of metal-insulator characteristics. An efficient interconnection scheme for advanced ULSI circuits requires materials with low effective time constants. In this regard, metals with low resistivity such as copper and the noble metals are emerging as materials of choice.

Some of the issues to be addressed in order for Cu-based interconnects to be a viable choice, especially as integration density continues to rise, involves the processes for patterning the copper lines, the prevention of diffusion of the copper into the underlying active substrate, the prevention of air corrosion on the surface of the copper and the uniformity of the microstructure of the copper. The issue of controlling and obtaining uniformity of the microstructure of the electroplated copper is addressed herein.

A more detailed background of the art regarding copper interconnects can be found with reference to the following publications which are incorporated herein by reference: R. L. Jackson, et al., "Processing and integration of copper interconnects", *Solid State Technology*, 49–59, March 1998; X. W. Lin et al., "Future interconnect technologies and copper metallization", *Solid State Technology*, 63–79, October 1998; and P. Singer, "Tantalum, Copper and Damascene: The Future of Interconnects", *Semiconductor International*, 91–98, June 1998.

Also, one may refer to The Metals Handbook, $8^{th}$ Edition, Vol. 1, page 802, "Properties and Selection of Metals", wherein various alloys of copper are discussed with respect to their physical and electrical properties and uses, including uses in connectors and sliding contacts, and which is incorporated herein by reference. It may be noted that there is no mention of the use of such alloys in IC's, nor of the self annealing problem of copper interconnects in IC's.

The recrystallization of electrodeposited copper due to self annealing and subsequent device processing which changes the mechanical and metallurgical properties of the copper requires a thorough understanding of microstructure control. If structural/property relationships and effects of annealing parameters are not well understood and controlled, a non-homogeneous microstructure can result which may lead to lower mechanical and electrical reliability of the finished integrated circuit device. Copper films have a tendency to self anneal over time. During this self annealing process, copper atoms migrate and cause the grain size of the microstructure to grow. This growth in grain size reduces sheet resistance and alters the mechanical properties of the film. Further, migration of copper atoms into underlying circuit elements e.g. the dielectric layers and/or the silicon are highly detrimental to device performance. It would therefore be desirable to control the copper microstructure to provide a uniform copper microstructure which is not substantially degraded by self annealing or during subsequent processing steps.

SUMMARY OF THE INVENTION

We now provide a method and structure to substantially eliminate the grain growth of copper due to self annealing. Basically, by properly alloying the copper interconnect, one can control and maintain the grain size of the copper and hence achieve a uniform microstructure while improving the strength, hardness and CMP removal rate of the interconnect while substantially maintaining the conductivity of the copper. Accordingly, the present invention is described as follows.

A method of making an integrated circuit having copper interconnects comprises alloying the copper of the interconnect with one or more elements which can control and maintain the grain size and grain boundaries of the copper, without significant loss of electrical properties, said alloying elements being present in an amount less than that which creates a second phase or precipitate within the alloy, at least at the annealing temperature.

The invention further includes the integrated circuit device having such alloyed copper interconnects.

BRIEF DESCRIPTION OF THE DRAWINGS

FIG. 1 is a cross-sectional view of a portion of an integrated circuit device depicting a copper interconnect structure.

DETAILED DESCRIPTION OF THE INVENTION

Referring to the FIGURE, there is shown a copper interconnect structure in an integrated circuit As shown, the device 10 comprises a silicon substrate 12, a metallization layer 14 over a portion of the substrate 12, a dielectric layer 16 having trenches, vias, damascene or dual damascene structures therein, the trenches or other structures being filled with a copper diffusion barrier layer 18, a copper seed layer 20 and a bulk copper interconnect 22. Typical dielectric layers 16 include silicon dioxide, tantalum oxide, low k dielectrics as are known in the art and polymeric xerogels and aerogels. Typical barrier layers 18 may be formed from materials such as Ta, TaN, Ta/TaN, TaSiN, WN or WSiN by vapor deposition or other techniques known in the art. The barrier layer 18 is generally about 25–500 Å thick. The function of the barrier layer 18 is to prevent the detrimental migration of copper into the dielectric 16 and the silicon 12. It should be noted that the invention is not limited to any specific barrier layer or barrier layer thickness. Other barrier layers including mono-layer self-assembled films can also be employed.

The copper seed layer 20 may be formed by PVD or CVD techniques which are well known in the art to a thickness preferably of from 25–2,000 Å. In one embodiment of the present invention the copper alloying elements are added to the seed layer 20 during deposition thereof. Thereafter, the bulk copper interconnect 22 is formed by methods well known in the art. While we believe that the preferred method of depositing the bulk copper layer is by known electrodeposition techniques, preferably utilizing standard commercially available electrochemical copper plating baths, the invention is meant to include other methods of depositing the bulk copper layer as well, e.g. by chemical vapor deposition. Typical copper electroplating baths, which are available from companies such as Enthone, Shipley, Lea Ronal and others, are generally comprised of copper sulfate, sulphuric acid, EDTA and a surfactant. The alloying elements in the seed layer 20 are then preferably diffused into the electroplated copper interconnect using a relatively low temperature (100° C.–400° C.) anneal for 1–3 hours in either a reducing gas, e.g. forming gas, or inert gas, e.g. $N_2$ or Argon atmosphere to cause the dopant to migrate to the grain boundaries of the electro-deposited copper and pin those boundaries so as to substantially prevent grain growth over time by self annealing. The dopant concentration should be below the solubility limit of the dopant in the copper at the annealing temperature.

Suitable alloying elements include Cr, Co, Zn and Ag. However, any element which would pin the grain boundaries without substantially adversely affecting the conductivity of the copper and without forming a second phase or precipitate at the annealing temperature may be employed. Typically, the resultant concentration of these elements in the electroplated copper is about 0.5 wt % or less. The exact amount of alloying element employed can be tailored to obtain not only a desired uniform microstructure but to enhance such properties as the CMP etch rate, strength and hardness of the interconnect. However, the concentration of alloying element should not exceed that which would cause a second phase or precipitate to appear in the copper microstructure at least at the annealing temperature, and preferably even at room temperature. Subsequent to electrodeposition and annealing, the device is completed by well known techniques.

In another embodiment of the invention, one can add the alloying element as a soluble dopant in the electroplating solution. Still other embodiments include using dopant-containing copper targets and sputter depositing the dopants utilizing such dopant-containing copper targets and sputter depositing the dopants utilizing such targets; alternatively depositing thin layers of dopant/copper/dopant etc. to form the seed layer, followed by annealing as set forth above; or doping the barrier layer and annealing to allow the dopant to migrate in and through the seed layer into the bulk copper interconnect.

What is claimed is:

1. A method of forming an integrated circuit device having copper interconnects which are not prone to grain growth due to self annealing, comprising:

forming a Cu seed layer having an alloy incorporated therein within a opening located within a substrate;

forming an interconnect within said opening and on said seed layer; and annealing said seed layer and interconnect to cause said alloy to diffuse solely from said seed layer into said interconnect such that a concentration of the alloy does not exceed that which would cause a precipitate of said alloy to appear.

2. The method recited in claim 1 further including forming a Cu migration barrier layer in said opening prior to forming said Cu seed layer, and wherein said interconnect is electrodeposited to essentially fill said opening.

3. The method recited in claim 1 wherein said alloy comprises at least one member of a group consisting of Cr, Co, Zn, and Ag.

4. The method recited in claim 1 wherein said alloy is incorporated into said seed layer during formation of that layer by a PVD or CVD process.

5. The method recited in claim 4 wherein said seed layer ranges from 25–2,000 Å thick.

6. The method recited in claim 1 wherein said seed layer is formed by forming alternate layers of copper and alloy.

7. The method recited in claim 1 wherein said annealing is at a temperature of from 100° C.–400° C. for 1–3 hours in a reducing or inert atmosphere.

* * * * *